United States Patent
Tseng et al.

(10) Patent No.: US 11,109,487 B2
(45) Date of Patent: Aug. 31, 2021

(54) ELECTRONIC DEVICE

(71) Applicant: InnoLux Corporation, Miao-Li County (TW)

(72) Inventors: Chun-Lung Tseng, Miao-Li County (TW); Hsin-Hung Chen, Miao-Li County (TW)

(73) Assignee: INNOLUX CORPORATION, Chu-Nan (TW)

( * ) Notice: Subject to any disclaimer, the term of this patent is extended or adjusted under 35 U.S.C. 154(b) by 0 days.

(21) Appl. No.: 16/707,144

(22) Filed: Dec. 9, 2019

(65) Prior Publication Data

US 2020/0221576 A1 Jul. 9, 2020

(30) Foreign Application Priority Data

Jan. 9, 2019 (CN) .......................... 201910020387.X

(51) Int. Cl.
*H05K 1/18* (2006.01)
*H05K 5/00* (2006.01)
*F21V 8/00* (2006.01)

(52) U.S. Cl.
CPC .......... *H05K 1/189* (2013.01); *G02B 6/0081* (2013.01); *H05K 5/0017* (2013.01); *H05K 2201/056* (2013.01); *H05K 2201/10128* (2013.01)

(58) Field of Classification Search
CPC .......... H05K 1/14; H05K 1/141; H05K 1/142; H05K 1/144; H05K 1/145; H05K 1/147; G02B 6/0081; G02B 6/0083
See application file for complete search history.

(56) References Cited

U.S. PATENT DOCUMENTS

| 10,739,627 | B2* | 8/2020 | Katagiri | G02F 1/13454 |
|---|---|---|---|---|
| 2002/0047953 | A1* | 4/2002 | Endo | G02B 6/0021 349/58 |
| 2005/0088830 | A1* | 4/2005 | Yumoto | H05K 1/147 361/749 |
| 2010/0097551 | A1* | 4/2010 | Yamagishi | G02F 1/1345 349/115 |
| 2010/0149834 | A1* | 6/2010 | Kim | G02B 6/0068 362/612 |
| 2016/0216436 | A1* | 7/2016 | Son | G02B 6/0011 |

FOREIGN PATENT DOCUMENTS

| CN | 108319074 A | 7/2018 |
|---|---|---|
| CN | 207799548 U | 8/2018 |

* cited by examiner

*Primary Examiner* — Hoa C Nguyen

(74) *Attorney, Agent, or Firm* — Muncy, Geissler, Olds & Lowe, P.C.

(57) ABSTRACT

An electronic device is disclosed, which includes: a display panel comprising a first substrate; a support unit disposed opposite to the display panel; a first circuit board electrically connected to the display panel and having a fist region and a second region, wherein the first region is not overlapped with the support unit in a normal direction of the first substrate, and the second region is overlapped with the support unit in the normal direction of the first substrate; and an electronic component disposed on the first region of the first circuit board.

20 Claims, 7 Drawing Sheets

ELECTRONIC DEVICE

CROSS REFERENCE TO RELATED APPLICATION

This application claims the benefits of the China Patent Application Serial Number 201910020387.X, filed on Jan. 9, 2019, the subject matter of which is incorporated herein by reference.

BACKGROUND

1. Field of the Disclosure

The present disclosure relates to an electronic device and, more particularly, to an electronic device having a circuit board with an improved design.

2. Description of Related Art

The module specifications of current electronic devices are mostly formulated by the Video Electronics Standards Association (VESA). However, the limited module specifications are gradually not in line with the consumer's demand regarding narrow bezel or thinning for electronic devices.

For example, currently, the electronic device uses the flexible circuit board to place a portion of electronic components under the display panel, which reduces the width of the bezel, but increases the thickness of the electronic device.

Therefore, there is an urgent need to develop an electronic device that can achieve the effect of thinning or narrow bezel.

SUMMARY

In view of the above, the object of the present disclosure is to provide an electronic device having a circuit board with an improved design, thereby achieving the effect of thinning or narrow bezel.

To achieve the above object, the present disclosure provides an electronic device, which comprises a display panel comprising a first substrate; a support unit disposed opposite to the display panel; a first circuit board electrically connected to the display panel and having a fist region and a second region, wherein the first region is not overlapped with the support unit in a normal direction of the first substrate, and the second region is overlapped with the support unit in the normal direction of the first substrate; and an electronic component disposed on the first region of the first circuit board.

DETAILED DESCRIPTION OF THE EMBODIMENT

In the following description, various embodiments will be provided to explain the implementation and operation of the present disclosure. The person skilled in the art of the present disclosure will understand the features and advantages of the present disclosure through these embodiments. Various combinations, modifications, substitutions or adaptations may be realized based on the present disclosure.

Further, the use of the ordinal numbers such as "first", "second", "third", "fourth", etc. in the specification and claims to modify the elements of the claims do not imply that a claimed element is physically provided with an ordinal number. The ordinal numbers do not represent the order between a claimed element and another claimed element, or the order of a manufacturing method. The use of these ordinal numbers is only for clearly distinguishing a claimed element having a certain name from another claimed element having the same name.

Moreover, the prepositions mentioned in the present specification and claims, such as "above", "over", or "on", may refer to direct contact of two elements, or may refer to indirect contact of two elements. Similarly, the prepositions mentioned in the specification and claims, such as "below", "beneath", or "under", may refer to direct contact of two elements, or may refer to indirect contact of two elements.

In the specification, the term "about", "approximately" or "around" generally means within 20%, 10%, 5%, 3%, 2%, 1%, or 0.5% of a given value or range. The quantity given here is an approximate quantity, that is, in the absence of specific recitation of "about", "approximately" or "around", the meanings of "about", "approximately" or "around" may still be implied.

The following gives exemplary embodiments of the present disclosure, but the present disclosure is not limited thereto. The present disclosure can be combined with other known structures to form another embodiment.

Figure 1A:
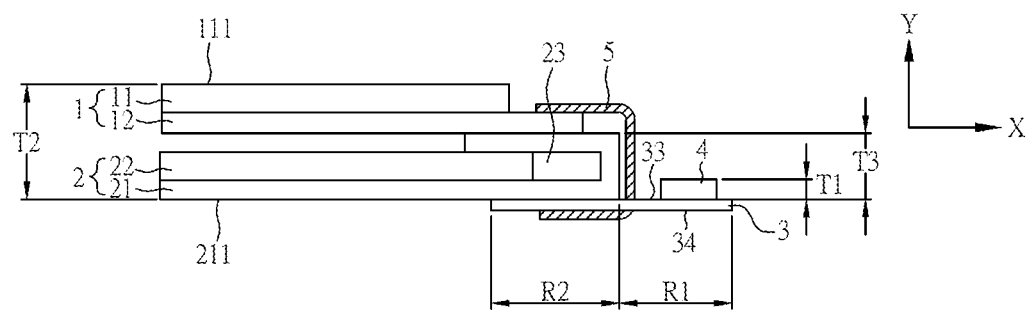
FIG. 1A is a cross section view of a portion of an electronic device according to a first embodiment of the present disclosure.
Figure 1B:
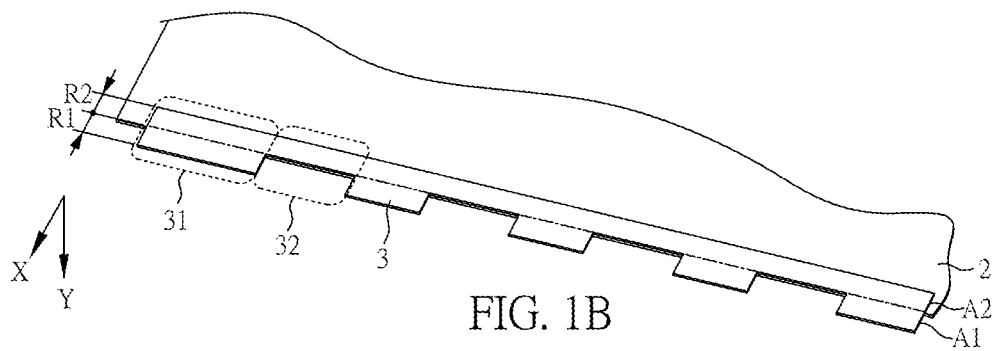
FIG. 1B is a bottom view of a portion of the electronic device according to the first embodiment of the present disclosure.
Figure 1C:
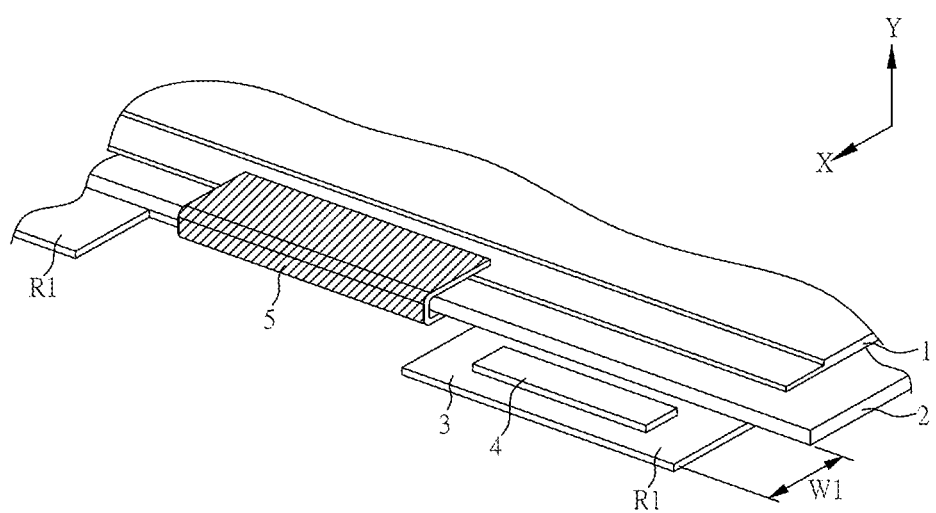
FIG. 1C is a top view of a portion of the electronic device according to the first embodiment of the present disclosure.

Please refer to FIGS. 1A-1C. FIG. 1A is a cross section view of a portion of an electronic device according to a first embodiment of the present disclosure. As shown in FIG. 1A, the electronic device of the present disclosure comprises a display panel 1 comprising a first substrate 11; a support unit 2 disposed opposite to the display panel 1; a first circuit board 3 electrically connected to the display panel 1 and having a first region R1 and a second region R2, wherein the first region R1 is not overlapped with the support unit 2 in a normal direction Y of the first substrate 11, and the second region R2 is overlapped with the support unit 2 in the normal direction Y of the first substrate 11; and an electronic component 4 disposed on the first region R1 of the first circuit board 3. Therefore, the electronic device of the present disclosure can obtain the effect of thinning by arranging the electronic component 4 on the first region R1 of the first circuit board 3. Further, due to the overlap of the second region R2 of the first circuit board 3 with the support unit 2 of the electronic device, the area and width of the first circuit board 3 that is actually exposed are reduced, such that the electronic device can provide the effect of narrow bezel.

In the present disclosure, the display panel 1 may comprise a second substrate 12, wherein the first substrate 11 disposed above the support unit 2 and the second substrate 12 disposed opposite to the first substrate 11. Furthermore, the support unit 2 may include a back plate 21, a light guide plate 22 or a combination thereof In a gap 23 formed between the back plate 21 and the light guide plate 22, an adhesive, a sealant, a light source (e.g. a light-emitting diode or a light tube) or other components may be provided as needed, but the present disclosure is not limited thereto. Any component that can support the display panel 1 may serve as the support unit 2 as described in the present disclosure, and the light guide plate 22 may closely attach to the back plate 21 without forming the gap 23. In another embodiment of the present disclosure, the support unit 2 includes the light guide plate 22 and excludes the back plate 21 to futher reduce the thickness of the electronic device. In the present disclosure, the light guide plate 22 may be a highly light-transmissive material such as glasses, plastics (e.g., PC, PMMA or PET), etc., and the surface of the light guide plate has an optical pattern (not shown) that can adjust the direction of exiting light. In some embodiments of the present disclosure, other optical films (not shown) capable of adjusting the direction of light, such as a diffusion film, a brightness enhancement film, a prism film, etc., may be placed over the light guide plate 22, but the present disclosure is not limited thereto.

Please refer to FIGS. 1A and 1B. FIG. 1B is a bottom view of a portion of the electronic device according to the first embodiment of the present disclosure. As shown in FIG. 1B, the first circuit board 3 includes at least one protruding section 31 and at least one connecting section 32. the at least one protruding section 31 contacts with the at least one connecting section 32 and extends in a direction. A maximum width of the at least one protruding section 31 in a first direction X is greater than a maximum width of the at least one connecting section 32 in the first direction X. In the present disclosure, as shown in FIG. 1A, the first direction X is perpendicular to both the normal direction Y of the first substrate 11 and the extension direction of the first circuit board 3. In the present embodiment, the at least one protruding section 31 is adjacent to and alternately arranged with the at least one connecting section 32. In the normal direction Y of the first substrate 11, the at least one protruding section 31 corresponds to the first region R1 and the second region R2, which means a partial region of the at least one protruding section 31 is not overlapped with the support unit 2. Also, in the present embodiment, an area of the at least one protruding section 31 is greater than that of the at least one connecting section 32. In other embodiments of the present disclosure, the at least one connecting section 32 has a greater length such that the area of the at least one connecting section 32 is larger than that of the at least one protruding section 31. In an embodiment of the present disclosure, the at least one connecting section 32 corresponds to the second region R2 in the normal direction Y of the first substrate 11, but the present disclosure is not limited thereto. In other embodiments of the present disclosure, the at least one connecting section 32 of the electronic device may correspond to both the first region R1 and the second region R2 in the normal direction Y of the first substrate 11. In addition, in the normal direction Y of the first substrate 11, the ratio of the area of the at least one connecting section 32 corresponding to the first region R1 and the second region R2 is different from the ratio of the area of the at least one protruding section 31 corresponding to the first region R1 and the second region R2.

In the present disclosure, the shapes of the protruding section 31 and the connecting section 32 are both rectangular, but the disclosure is not limited thereto. Said shapes may be adjusted as needed for the electronic device and may be, for example, elliptical, trapezoidal, or irregular.

As shown in FIG. 1B, in an embodiment of the present disclosure, a total area of the first region R1 of the first circuit board 3 is defined as a first area A1, and a total area of the second region R2 of the first circuit board 3 is defined as a second area A2, wherein the first area A1 is different from the second area A2 and, more specifically, the first area A1 is smaller than the second area A2.

In an embodiment of the present disclosure, as shown in FIGS. 1A and 1C, in which FIG. 1C is a top view of a portion of the electronic device according to the first embodiment of the present disclosure, the electronic device may further include a second circuit board 5. The first circuit board 3 may be electrically connected to the display panel 1 through the second circuit board 5, and the second circuit board 5 may be disposed corresponding to one of the at least one connecting section 32. As shown in FIGS. 1A and 1C, the second circuit board 5 is not overlapped with the electronic component 4 in the normal direction Y of the first substrate 11.

In order to obtain the electronic device as shown in FIGS. 1A and 1C, in the electronic device of the present disclosure, the second circuit board 5 may be electrically connected to the display panel 1 and the first circuit board 3, respectively, and then the second circuit board 5 is bent such that the first circuit board 3 is disposed below the support unit 2 and a portion of the first circuit board 3 is located between the second circuit board 5 and the support unit 2. Furthermore, the first circuit board 3 can be fixed by a glue layer (not shown) or other physical means. The electronic component 4 can be disposed on the first region R1 of the first circuit board 3 before the second circuit board 5 is bent or after the first circuit board 3 has been disposed under the support unit 2. In this embodiment, the first circuit board 3 includes a first surface 33 and a second surface 34 disposed opposite to the first surface 33, and the electronic component 4 is disposed on the first surface 33 of the first circuit board 3. Moreover, the first circuit board 3 contacts the second circuit board 5 at the second surface 34 of the first circuit board 3, but the present disclosure is not limited thereto. As shown in FIG. 1A, a portion of the first circuit board 3 is overlapped with the support unit 2 of the electronic device such that the effect of narrow bezel can be achieved.

In the present disclosure, the first substrate 11, the second substrate 12 and the first circuit board 3 may be rigid substrates, flexible substrates, or thin films, and may be made of the same or different materials. The materials of the first substrate 11, the second substrate 12 and the first circuit board 3 may include, for example, quartz, glass, silicon wafer, sapphire, polycarbonate (PC), polyimide (PI), polypropylene (PP), polyethylene terephthalate (PET), and other plastic and polymer materials, but the present disclosure is not limited thereto. The second circuit board 5 may be a flexible substrate or a thin film, and the material of the second circuit board 5 may include, for example, polycarbonate (PC), polyimide (PI), polypropylene (PP), polyethylene terephthalate (PET), and other plastic and polymeric materials, but the present disclosure is not limited thereto.

In the present disclosure, the electronic component 4 may include a capacitor, a resistor, an integrated circuit (IC), a connector, or a combination thereof, but the present disclosure is not limited thereto. In the present disclosure, the electronic component 4 has a first thickness T1, which is less than or equal to a second thickness T2 from a top surface 111 of the display panel 1 to a bottom surface 211 of the support unit 2, or even less than or equal to a third thickness T3 of the support unit 2. In the present disclosure, the first thickness T1 represents a maximum height of the electronic component 4 in the normal direction Y of the first substrate 11, the second thickness T2 represents a maximum height of a combination of the display panel 1 and the support unit 2 in the normal direction Y of the first substrate 11, and the third thickness T3 represents a maximum height of the support unit 2 in the normal direction Y of the first substrate 11. Each thickness is not particularly limited in the numerical range, and may be adjusted depending on the type of the electronic component 4 or the need of the electronic device. As shown in FIG. 1A, since both the electronic component 4 and the support unit 2 are disposed on the first surface 33 in the electronic device of the present disclosure, and the first thickness T1 of the electronic component 4 is less than or equal to the second thickness T2, or even less than or equal to the third thickness T3 of the support unit 2, the effect of thinning can be realized.

In the present disclosure, as shown in FIG. 1C, the first region R1 has a first width W1 in the first direction X, and the first width W1 is greater than or equal to 1 mm and less than or equal to 15 mm (1 mm≤W1≤15 mm) For example, W1 is greater than or equal to 2 mm and less than or equal to 10 mm, or W1 is greater than or equal to 3 mm and less than or equal to 5 mm, but the present disclosure is not limited thereto.

In the present disclosure, the display panel 1 may further include a display medium (not shown) disposed between the first substrate 11 and the second substrate 12. The display medium may include liquid crystal (LC), organic light-emitting diodes (OLEDs), quantum dots (QDs), quantum dot light-emitting diodes (QLEDs or QDLEDs), a fluorescent material, a phosphor material, light-emitting diodes (LEDs), micro light-emitting diodes or mini light-emitting diodes, other display medium or a combination thereof, but the present disclosure is not limited thereto.

Figure 2A:
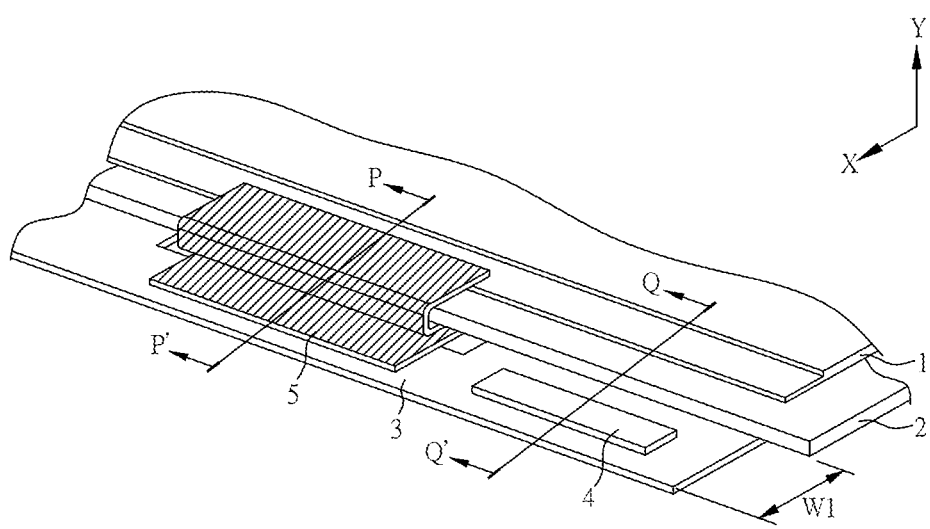
FIG. 2A is a top view of a portion of the electronic device according to the second embodiment of the present disclosure.
Figure 2B:
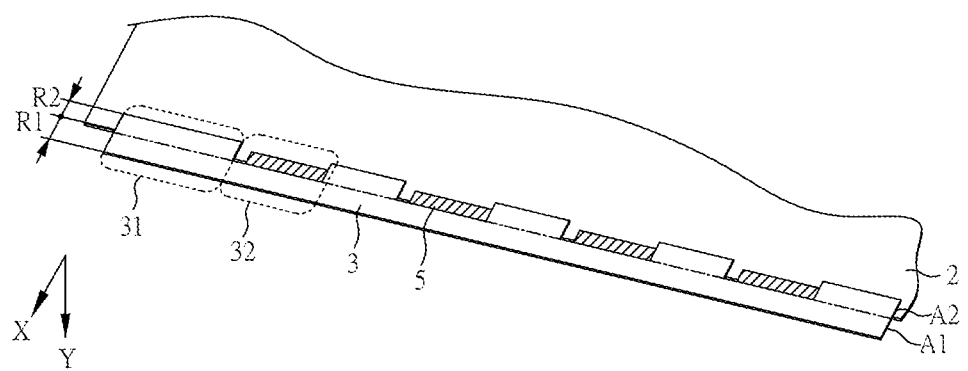
FIG. 2B is a bottom view of a portion of the electronic device according to the second embodiment of the present disclosure.
Figure 2C:
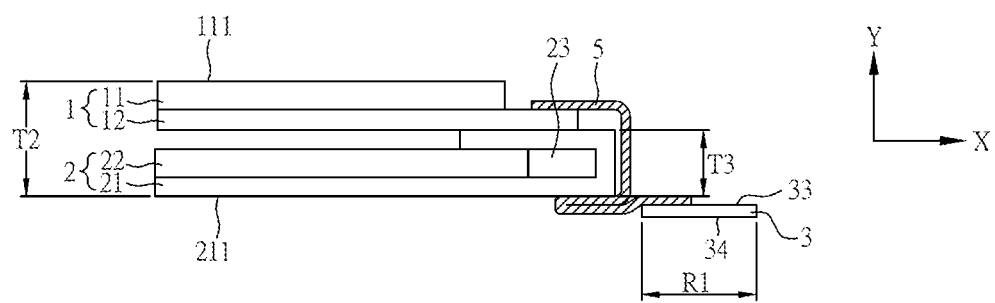
FIG. 2C and FIG. 2D are cross-sectional views of a portion of the electronic device according to the second embodiment of the present disclosure.
Figure 2D:
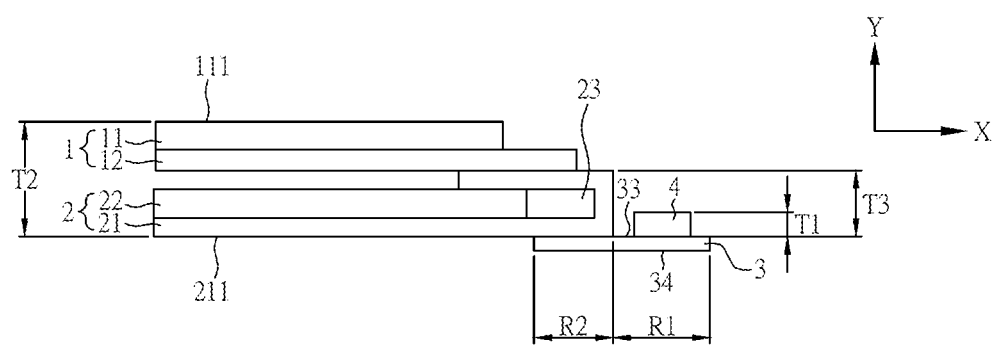

FIG. 2A is a top view of a portion of the electronic device according to the second embodiment of the present disclosure; FIG. 2B is a bottom view of a portion of the electronic device according to the second embodiment of the present disclosure; FIG. 2C is a cross-sectional view taken along line P-P' in FIG. 2A; and FIG. 2D is a cross-sectional view taken along line Q-Q' in FIG. 2A. The electronic device of FIGS. 2A to 2D is similar to that of FIGS. 1A to 1C except those described in the following paragraphs.

As shown in FIGS. 2A and 2B, the first circuit board 3 includes at least one protruding section 31 and at least one connecting section 32, and the at least one protruding section 31 is in contact with the at least one connecting section 32. In this embodiment, the at least one protruding section 31 is adjacent to and alternately arranged with the at least one connecting section 32. Furthermore, in the bottom view direction, the at least one protruding section 31 corresponds to the first region R1 and the second region R2, and the at least one connecting section 32 corresponds to the first region R1 in the normal direction Y of the first substrate 11, but the present disclosure is not limited thereto. In other embodiments of the present disclosure, the at least one connecting section 32 may correspond to the first region R1 and the second region R2 in the normal direction Y of the first substrate 11, and the ratio of the area of the at least one connecting section 32 corresponding to the first region R1 and the second region R2 is different from the ratio of the area of the at least one protruding section 31 corresponding to the first region R1 and the second region R2 in the normal direction Y of the first substrate 11 in the electronic device.

As shown in FIG. 2B, in one embodiment of the present disclosure, a total area of the first region R1 of the first circuit board 3 is defined as a first area A1, and a total area of the second region R2 of the first circuit board 3 is defined as a second area A2, wherein the first area A1 is different from the second area A2 and, more specifically, the first area A1 is greater than the second area A2.

To obtain the electronic device as shown in FIGS. 2A to 2D, in the electronic device of the present disclosure, the second circuit board 5 can be electrically connected to the display panel 1 and the first circuit board 3, respectively, and then the second circuit board 5 can be bent to be disposed beneath the support unit 2 such that the first circuit board 3 is disposed under the support unit 2 while the support unit 2 is located between the first circuit board 3 and the display panel 1. Further, the electronic component 4 may be disposed on the first region R1 of the first circuit board 3 before the second circuit board 5 is bent or after the first circuit board 3 has been disposed under the support unit 2 to form the electronic device demonstrated in this embodiment. More specifically, due to the corresponding arrangement of the second circuit board 5 with one of the at least one connecting section 32 and the structure design of the first circuit board 3, the thickness of the electronic device can be prevented from increasing. Therefore, in the normal direction Y of the first substrate 11, the second circuit board 5 bent to the backside of the support unit 2 is not overlapped with the first circuit board 3. In addition, as shown in FIG. 2D, the electronic component 4 is disposed on the first region R1 of the first circuit board 3 to achieve the effect of narrow bezel or thinning In other words, as shown in FIG. 2A, the first circuit board 3 contacts the second circuit board 5 at the same side of the first circuit board 3 as the electronic component 4. More specifically, the first circuit board 3 includes a first surface 33 and a second surface 34 disposed opposite to the first surface 33. The electronic component 4 is disposed on the first surface 33 of the first circuit board 3, and the first circuit board 3 contacts the second circuit board 5 at the first surface 33 of the first circuit board 3, but the present disclosure is not limited thereto.

FIGS. 3A to 3E are each a top view of a first circuit board according to other embodiment of the present disclosure, wherein the first circuit boards of FIGS. 3A to 3E can be assembled with the electronic device of FIG. 1A or FIG. 2A respectively to form other electronic devices.

Figure 3A:
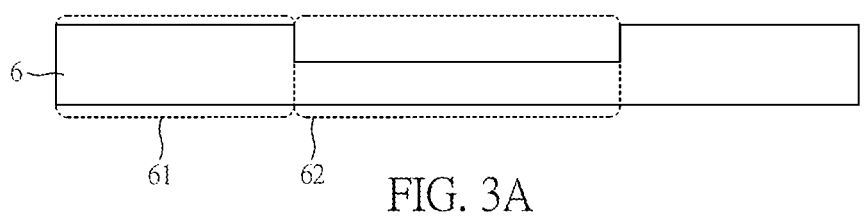
FIGS. 3A to 3E are top views of the first circuit boards according to other embodiments of the present disclosure.
Figure 3B:
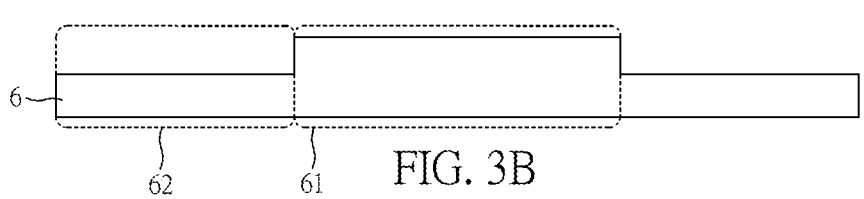
Figure 3C:
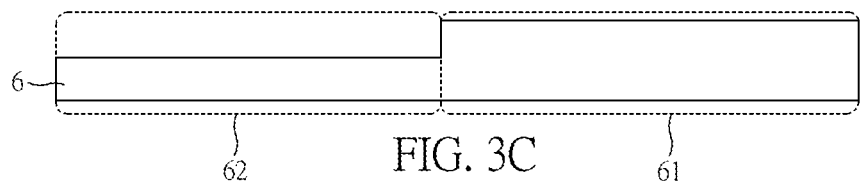

In the present disclosure, the first circuit boards 6 in FIGS. 3A to 3C are similar to the first circuit board 3 in FIG. 1B or FIG. 2B, except that the number of the protruding section 61 and the connecting section 62 of the first circuit board 6 in FIG. 3A, 3B or 3C is less than that of the protruding section 31 and the connecting section 32 of the first circuit board 3 in FIG. 1B or FIG. 2B. Taking the first circuit board 6 in FIG. 3A as an example, the first circuit board 6 in FIG. 3A may include two protruding sections 61 and one connecting section 62, but the disclosure is not limited thereto. For example, the first circuit board 6 of the present disclosure can also include one protruding section 61 and two connecting sections 62 as shown in FIG. 3B or include one protruding section 61 and one connecting section 62 as shown in FIG. 3C, but the present disclosure is not limited thereto. The number, shape, size, and position of the protruding section 61 and the connecting section 62 can be adjusted as needed for the electronic device.

Figure 3D:
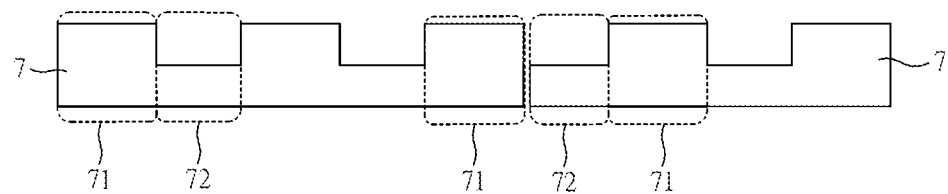

FIG. 3D is a top view of another first circuit board 7 of the present disclosure. The first circuit boards 7 in FIG. 3D is similar to the first circuit board 3 in FIG. 1B or FIG. 2B, except that there are a plurality of the first circuit boards 7 in FIG. 3D, and at least two adjacent circuit boards of the plurality of the first circuit boards 7 may or may not contact with each other, but the disclosure is not limited thereto. When the size of the electronic device becomes larger, the use of the plurality of the first circuit boards 7 can reduce the size of the individual first circuit board 7, decrease the difficulty and cost of producing the circuit boards, and further lower the overall cost of the electronic device.

Figure 3E:
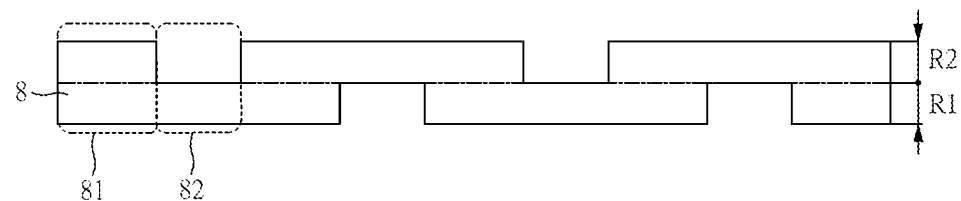

FIG. 3E is a top view of another first circuit board 8 of the present disclosure. The first circuit boards 8 in FIG. 3E is similar to the first circuit board 3 in FIG. 1B or FIG. 2B, except that a plurality of connecting sections 82 of the first circuit boards 8 in FIG. 3E may correspond to the first region R1, the second region R2 or both.

In summary, the present disclosure provides a first circuit board with an improved design and arranges an electronic device on the first circuit board to achieve the effect of thinning or narrow bezel for the electronic device.

Although the present invention has been explained in relation to its preferred embodiment, it is to be understood that many other possible modifications and variations can be made without departing from the spirit and scope of the invention as hereinafter claimed.

What is claimed is:

1. An electronic device, comprising:
a display panel comprising a first substrate;
a support unit disposed opposite to the display panel;
a first circuit board electrically connected to the display panel and having a first region and a second region, wherein the first region is not overlapped with the support unit in a normal direction of the first substrate, and the second region is overlapped with the support unit in the normal direction of the first substrate;
a second circuit board having a surface, wherein the surface comprises a first portion and a second portion opposite to the first portion, the support unit is disposed between the first portion and the second portion, and the first circuit board is electrically connected to the display panel through the second circuit board; and
an electronic component disposed on the first region of the first circuit board.

2. The electronic device of claim 1, wherein the first circuit board includes at least one protruding section and at least one connecting section.

3. The electronic device of claim 2, wherein the at least one protruding section is adjacent to and alternately arranged with the at least one connecting section.

4. The electronic device of claim 2, wherein an area of the at least one protruding section is larger than an area of the at least one connecting section.

5. The electronic device of claim 2, wherein the at least one protruding section corresponds to the first region and the second region.

6. The electronic device of claim 2, wherein the at least one connecting section corresponds to the second region.

7. The electronic device of claim 2, wherein the at least one connecting section corresponds to the first region and the second region.

8. The electronic device of claim 7, wherein a ratio of an area of the at least one connecting section corresponding to the first region and the second region is different from a ratio of an area of the at least one protruding section corresponding to the first region and the second region.

9. The electronic device of claim 2, wherein a width of the at least one protruding section is larger than a width of the at least one connecting section.

10. The electronic device of claim 2, the second circuit board is disposed corresponding to one of the at least one connecting section.

11. The electronic device of claim 10, wherein the first circuit board has a first surface and a second surface, the electronic component is disposed on the first surface and the second circuit board contacts the first circuit board at the first surface or the second surface.

12. The electronic device of claim 1, wherein a total area of the first region of the first circuit board is defined as a first area, a total area of the second region of the first circuit board is defined as a second area, and the first area is different from the second area.

13. The electronic device of claim 12, wherein the first area is smaller than the second area.

14. The electronic device of claim 12, wherein the first area is greater than the second area.

15. The electronic device of claim 1, wherein the electronic component has a first thickness, and the first thickness is less than or equal to a second thickness from a top surface of the display panel to a bottom surface of the support unit.

16. The electronic device of claim 15, wherein the support unit has a third thickness, and the first thickness is less than or equal to the third thickness.

17. The electronic device of claim 1, wherein the first region has a first width in a first direction, and the first width is greater than or equal to 1 mm and less than or equal to 15 mm.

18. The electronic device of claim 1, further comprising a second substrate, wherein the first substrate is disposed above the support unit, and the second substrate is disposed opposite to the first substrate.

19. The electronic device of claim 18, further comprising a display medium disposed between the first substrate and the second substrate.

20. The electronic device of claim 1, wherein the support unit comprises a back plate, a light guide plate or a combination thereof.

* * * * *